United States Patent
Wang et al.

(10) Patent No.: US 11,392,035 B2
(45) Date of Patent: Jul. 19, 2022

(54) GAP FILLING COMPOSITION AND PATTERN FORMING METHOD USING COMPOSITION CONTAINING POLYMER

(71) Applicant: AZ Electronic Materials (Luxembourg) S.a.r.l., Luxembourg (LU)

(72) Inventors: Xiaowei Wang, Iwata (JP); Tatsuro Nagahara, Kakegawa (JP)

(73) Assignee: MERCK PATENT GMBH, Darmstadt (DE)

( * ) Notice: Subject to any disclaimer, the term of this patent is extended or adjusted under 35 U.S.C. 154(b) by 778 days.

(21) Appl. No.: 16/303,813

(22) PCT Filed: May 29, 2017

(86) PCT No.: PCT/EP2017/062821
§ 371 (c)(1),
(2) Date: Nov. 21, 2018

(87) PCT Pub. No.: WO2017/207452
PCT Pub. Date: Dec. 7, 2017

(65) Prior Publication Data
US 2020/0319556 A1     Oct. 8, 2020

(30) Foreign Application Priority Data

May 30, 2016 (JP) .............................. JP2016-107820
Oct. 18, 2016 (JP) ................................. 2016-204550

(51) Int. Cl.
*G03F 7/09*     (2006.01)
*G03F 7/004*    (2006.01)
(Continued)

(52) U.S. Cl.
CPC ............ *G03F 7/094* (2013.01); *G03F 7/0043* (2013.01); *G03F 7/162* (2013.01); *G03F 7/168* (2013.01);
(Continued)

(58) Field of Classification Search
CPC ........ G03F 7/094; G03F 7/0043; G03F 7/162; G03F 7/168; G03F 7/2006; G03F 7/38;
(Continued)

(56) References Cited

U.S. PATENT DOCUMENTS 8,795,952 B2     8/2014 Somervell et al.
2002/0127866 A1* 9/2002 Kwean .................... H01L 28/91
                                                      438/694

(Continued)

FOREIGN PATENT DOCUMENTS

EP     0147322 A2     7/1985
EP     1150343 A2    10/2001
(Continued)

OTHER PUBLICATIONS

Polypropylene carbonate—Wikipedia (Year: 2021).*
(Continued)

*Primary Examiner* — Duy Vu N Deo
(74) *Attorney, Agent, or Firm* — Faegre Drinker Biddle & Reath LLP

(57) ABSTRACT

[Subject] There is provided a gap filling composition which can reduce pattern collapse and a pattern forming method using the composition. [Solution means] There is provided a gap filling composition including a polymer having a certain structure and an organic solvent. There is provided a pattern forming method using a certain polymer.

19 Claims, 3 Drawing Sheets

(51) Int. Cl.
*G03F 7/16* (2006.01)
*G03F 7/20* (2006.01)
*H01L 21/02* (2006.01)
*H01L 21/311* (2006.01)

(52) U.S. Cl.
CPC ........ *G03F 7/2006* (2013.01); *H01L 21/0206* (2013.01); *H01L 21/31127* (2013.01); *H01L 21/31111* (2013.01); *H01L 21/31116* (2013.01)

(58) Field of Classification Search
CPC ... G03F 7/40; G03F 7/325; G03F 7/09; H01L 21/0206; H01L 21/31127; H01L 21/31111; H01L 21/31116
USPC ...................................................... 430/286.1
See application file for complete search history.

(56) References Cited

U.S. PATENT DOCUMENTS

| | | |
|---|---|---|
| 2003/0130148 A1 | 7/2003 | Lee et al. |
| 2003/0146416 A1 | 8/2003 | Takei et al. |
| 2008/0070393 A1 | 3/2008 | Miyairi et al. |
| 2010/0308015 A1 | 12/2010 | Takano et al. |
| 2011/0205505 A1* | 8/2011 | Somervell ............. G03F 7/405 355/27 |
| 2015/0221500 A1* | 8/2015 | Ogihara ................. B08B 3/08 134/19 |
| 2016/0027653 A1 | 1/2016 | Tachibana et al. |

FOREIGN PATENT DOCUMENTS

| | | |
|---|---|---|
| EP | 1598703 A1 | 11/2005 |
| KR | 10-2003-0050173 A | 6/2003 |
| KR | 10-2008-0018839 A | 2/2008 |
| KR | 10-2008-0028497 A | 3/2008 |
| WO | WO-2016172737 A1 * | 10/2016 ........... G03F 7/0043 |

OTHER PUBLICATIONS

Ether—Wikipedia (Year: 2021).*
Polypropylene glycol—Wikipedia (Year: 2021).*
International Preliminary Reporton Patentability received for PCT Application No. PCT/EP2017/062821, dated Dec. 13, 2018, 9 pages.
International Search Report for PCT/EP2017/062821 dated Aug. 16, 2017.
Tokuhisa, C., "Reactive Ion Etching", Toshiba Review, vol. 59, No. 8, (2004), pp. 22-25 (in Japanese).
Written Opinion of the International Searching Authority for PCT/EP2017/062821 dated Aug. 16, 2017.

* cited by examiner (a)

(b)

(a)

(d)

(b)

(e)

(c)

(f)

GAP FILLING COMPOSITION AND PATTERN FORMING METHOD USING COMPOSITION CONTAINING POLYMER

CROSS-REFERENCE TO RELATED APPLICATIONS

This application is a national stage application (under 35 U.S.C. § 371) of PCT/EP2017/062821, filed May 29, 2017, which claims benefit of Japanese Application Nos. 2016-107820, filed May 30, 2016, and 2016-204550, filed Oct. 18, 2016, all of which are incorporated herein by reference in their entirety.

BACKGROUND OF THE INVENTION

Field of the Invention

The present invention relates to a gap filling composition and a pattern forming method using a polymer. Specifically, the present invention relates to a gap filling composition used, in a semiconductor manufacturing process, for forming a pattern having a high aspect ratio, and to a pattern forming method enabling reduction of pattern collapse by using a composition containing a certain polymer.

Background Art

In recent years, increasing demand for highly integrated LSIs requires miniaturization of patterns. In order to address such demand, lithography processes having a short wavelength are being put to practical use, such as KrF excimer laser (248 nm), ArF excimer laser (193 nm), extreme ultraviolet ray (EUV, 13 nm), X-ray, and electron beam. In order to address such miniaturization of resist pattern, photosensitive resin compositions used as a resist in microfabrication are also required to be highly resolved. However, advanced miniaturization as described above tends to cause resist pattern collapse. Against this problem, improvement of resists, for example, by alteration of their composition is under consideration.

In addition, the resist pattern collapse is thought to occur owing to negative pressure generated between patterns caused by surface tension of pure water with which the patterns are rinsed after development. From this viewpoint, in order to reduce resist pattern collapse, a rinsing solution is proposed to be used for rinse in place of conventionally used pure water.

Further, a method is proposed which fills a gap filling agent into portions between resist patterns, and then dries and removes the gap filling agent, to reduce pattern collapse (For example, Patent literature 1).

PRIOR ART REFERENCES

Patent Literature

[Patent literature 1] U.S. Pat. No. 8,795,952

Non-Patent Literature

[Non-patent literature 1] Toshiba Review Vol. 59 No. 8 (2004), pp 22-25

SUMMARY OF THE INVENTION

Problems to be Solved by the Invention

Although a rinsing solution for lithography known in the prior art attempts to reduce resist pattern collapse by relaxing surface tension, it is insufficient for preventing patterns having a high aspect ratio from pattern collapse.

The present inventors have found that the method described in Patent literature 1 generally requires high temperature processing in order to vaporize a polymer contained in a gap filling agent, and is likely to impact resist patterns. Further, these problems of pattern collapse may occur for not only resist patterns but also patterns formed from a material other than the resist by using the resist patterns as a mask.

The present invention has been achieved in view of the above-described background and provides not only a gap filling composition which is less likely to impact pattern shapes even when applied to a pattern having a high aspect ratio and can reduce pattern collapse, but also a pattern forming method using a composition containing a certain polymer. Further, the present invention provides a device which includes a pattern formed by the pattern forming method and has excellent characteristics.

Means for Solving the Problems

The gap filling composition according to the present invention includes:
a polymer (I) which contains repeating units represented by the following general formula (i),

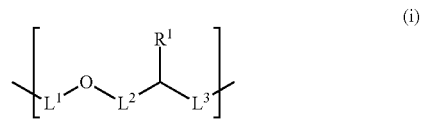

(wherein
R$^1$ represents hydrogen or alkyl having 1 to 5 carbon atoms,
L$^1$ represents oxycarbonyl or a single bond,
L$^2$ represents alkylene having 1 to 3 carbon atoms, oxy, or a single bond,
L$^3$ represents alkylene having 1 to 3 carbon atoms, oxy, or a single bond), and
a solvent.

Further, the first pattern forming method according to the present invention includes
(A1) a step of etching a layer to be processed to form a gap,
(A2) a step of filling a liquid into the gap;
(A3) a step of filling a composition comprising a polymer having a mass average molecular weight of not less than 1,000 and not more than 500,000 into said gap to replace said liquid; and
(A4) a step of removing said composition by heating.

Further, the second pattern forming method according to the present invention includes
(B1) a step of forming a resist film on a surface of a layer to be processed;
(B2) a step of exposing said resist film;
(B3) a step of contacting a composition comprising a polymer having a mass average molecular weight of not less than 1,000 and not more than 500,000 with said resist film; and
(B4) a step of dry-etching said resist film and said layer to be processed,
wherein an etching rate of said resist film under a dry-etching condition in said step (B4) is not more than 0.5 times as large as an etching rate of said layer to be processed.

Effect of the Invention

By using the composition according to the present invention, pattern collapse of formed patterns can be reduced. In addition, the composition according to the present invention has excellent coatability. For patterns formed by using the method according to the present invention, few residues remain on the layer to be processed after removal of the composition of the present invention.

DETAILED DESCRIPTION OF THE INVENTION

Figure 1:
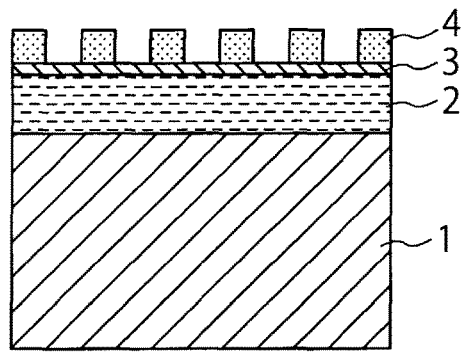
FIG. 1 is an explanatory drawing of a pattern forming method according to the first embodiment of the present invention.
Figure 1:
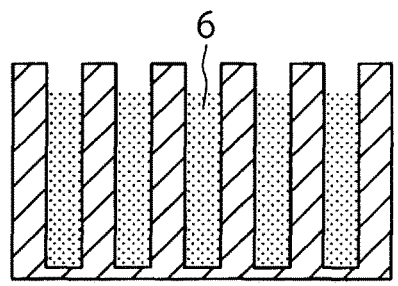
Figure 1:
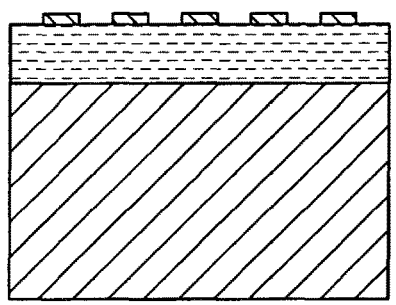
Figure 1:
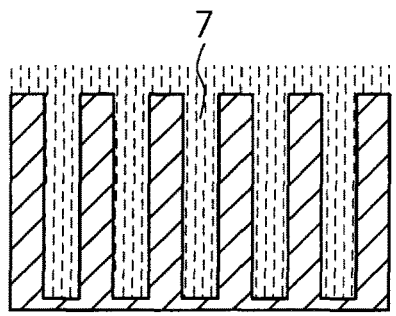
Figure 1:
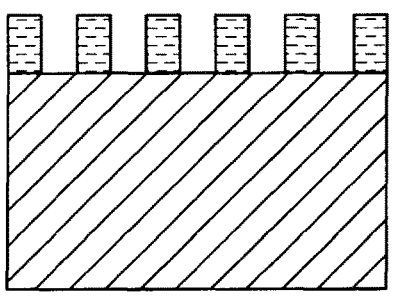
Figure 1:
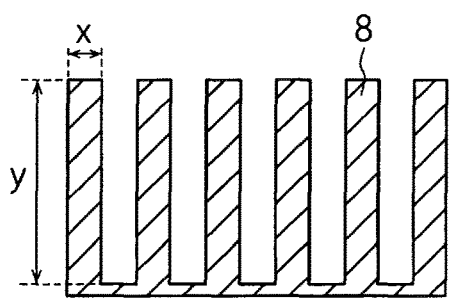
Figure 1:
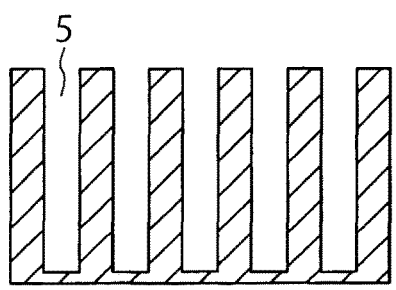

A detailed description of an embodiment of the present invention is as follows.

Gap Filling Composition

The gap filling composition according to the present invention is filled into formed gaps such as trenches or holes, or replaced with a liquid or a material already existing in the latently formed gaps, and subsequently removed by heating or etching, during pattern formation by processing a layer to be processed by photolithography.

The gap filling composition according to the present invention includes a polymer having a mass average molecular weight of not less than 1,000 and not more than 500,000, and a solvent. Further, it includes, as required, other components. Each of these components is described below.

(1) Polymer (I)

The gap filling composition used in the present invention includes a polymer having a mass average molecular weight of not less than 1,000 and not more than 500,000. This polymer preferably contains repeating units represented by the following general formula (i),

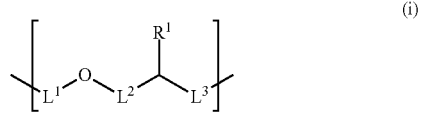

(i)

(wherein
R$^1$ represents hydrogen or alkyl having 1 to 5 carbon atoms,
L$^1$ represents oxycarbonyl or a single bond,
L$^2$ represents alkylene having 1 to 3 carbon atoms, oxy, or a single bond,
L$^3$ represents alkylene having 1 to 3 carbon atoms, oxy, or a single bond).

In the general formula (i), examples of R$^1$ include hydrogen, methyl, ethyl, n-propyl, isopropyl, n-butyl, isobutyl, n-pentyl, isopentyl, neopentyl, tert-pentyl, and so on. R$^1$ is preferably hydrogen, and methyl.

In the general formula (i), L$^1$ represents oxycarbonyl or a single bond, and the oxycarbonyl herein means a group represented by the following general formula. It is preferred to be the O atom on the right of the L in the general formula (i) that is directly bonded to the carbon atom in the following formula.

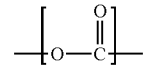

In the general formula (i), L$^2$ and L$^3$ each independently represent, for example, a single bond, oxy, methylene, ethylene, and propylene. L$^2$ is preferably a single bond and methylene.

The polymer (I) may contain repeating units other than the repeating units represented by the general formula (i), wherein the percentage of the repeating units represented by the general formula (i) to the total number of the repeating units contained in the polymer (I) is preferably not less than 50 mol % and not more than 100 mol %, more preferably not less than 70 mol % and not more than 100 mol %, and still more preferably not less than 90 mol % and not more than 100 mol %.

Specifically, representative examples of the polymer (I) include polyethyleneglycol, polypropylene glycol, polypropylene carbonate, polyethylene carbonate, polyethylene propylene glycol, and polyacetal. Among them, polyethylene glycol and polypropylene carbonate are preferred compounds.

These polymers (I) can be used, as required, in combination of two or more polymers.

The mass average molecular weight Mw of the polymer (I) according to the present invention is selected depending on the shape or composition, or way of application of resist patterns to which the composition according to the present invention is applied. Typically, the mass average molecular weight of the polymer (I) according to the present invention is preferably not less than 1,000 and not more than 500,000, more preferably not less than 10,000 and not more than 300,000, and still more preferably not less than 10,000 and not more than 30,000, from the view point of its filling property and thermal decomposability. The mass average molecular weight Mw used herein is a weight average molecular weight in terms of polystyrene, and can be measured by gel permeation chromatography as a polystyrene standard.

(2) Solvent

The gap filling composition according to the present invention includes a solvent in order to improve its filling property, coatability, and temporal stability. Any solvent can be used so long as it can dissolve the polymer (I) and is more volatile than the polymer (I). Further, the solvent may be a mixture of plural solvents.

The gap filling composition according to the present invention is a composition which can be used for pattern formation methods A and B, which will be described below (in detail). In the pattern forming method A, this composition is applied to the layer to be processed which is rotated, for example, at a rotational speed of not less than 1 rpm and not more than 400 rpm. In this instance, it is preferable that the polymer (I) does not volatilize while the solvent volatilizes. In the pattern forming method B, this composition is contacted with an exposed resist film. In this instance, it is preferable to dissolve only the exposed portion.

Examples of the solvent include water, ethylene glycol monoalkyl ethers, such as ethylene glycol monomethyl ether (PGME), ethylene glycol monoethyl ether, ethylene glycol monopropyl ether, and ethylene glycol monobutyl ether, diethylene glycol dialkyl ethers, such as diethylene glycol dimethyl ether, diethylene glycol diethyl ether, diethylene glycol dipropyl ether, and diethylene glycol dibutyl ether, ethylene glycol alkyl ether acetates, such as methyl cellosolve acetate and ethyl cellosolve acetate, propylene glycol alkyl ether acetates, such as propylene glycol monomethyl ether acetate (PGMEA), propylene glycol monoethyl ether acetate, and propylene glycol monopropyl ether acetate, aromatic hydrocarbons, such as benzene, toluene, and xylene, ketones, such as methyl ethyl ketone, acetone, methyl amyl ketone, methyl isobutyl ketone, cyclohexanone, and 2-heptanone, alcohols, such as ethanol, propanol (for example, isopropyl alcohol (IPA)), butanol (for example, n-butyl alcohol), hexanol, cyclohexanol, ethylene glycol, and glycerin, esters, such as ethyl lactate, methyl acetate, ethyl acetate, butyl acetate, ethyl 3-ethoxypropionate, and methyl 3-methoxypropionate, cyclic esters such as γ-butyrolactone, tetrahydrofuran (THF), and ethers such as dibutyl ether. When the gap filling composition according to the present invention is used for the pattern forming method A, preferable among them is a solvent selected from water, PGMEA, PGME, IPA, n-butyl alcohol, methyl isobutyl ketone, tetrahydrofuran, dibutyl ether, ethyl lactate, methyl acetate, ethyl acetate, butyl acetate, 2-heptanone, γ-butyrolactone, and combinations thereof, from the viewpoint of its availability and ease of handling, and the solubility of the polymer (I) thereto, and so on. Water, PGMEA, and butyl acetate are more preferable. When the gap filling composition according to the present invention is used for the pattern forming method B, since the difference of solubility between an exposed portion and an unexposed portion in the composition is great, an organic solvent, for example one selected from the group consisting of PGMEA and butyl acetate is preferred.

Water to be used is not particularly limited, but it is preferably water, for example pure water, from which organic impurities and metal ions were removed by distillation, an ion exchange treatment, a filtration treatment, and various adsorption treatments.

The mass ratios of the polymer (I) and the solvent to the total mass of the gap filling composition according to the present invention are preferably not less than 2% and not more than 40% and not less than 20% and not more than 98%, respectively. They are more preferably not less than 2% and not more than 30% and not less than 20% and 98%. They are still more preferably not less than 2% and not more than 20% and not less than 50% and not more than 95%. In the gap filling composition according to the present invention, the sum of the polymer (I) and the solvent never exceeds 100%.

The viscosity at 25° C. of the gap filling composition of the present invention is preferably not less than $1\times10^{-3}$ Pa·s and not more than $100\times10^{-3}$ Pa·s, more preferably not less than $1\times10^{-3}$ Pa·s not less than and not more than $70\times10^{-3}$ Pa·s, and still more preferably not less than $1\times10^{-3}$ Pa·s and not more than $40\times10^{-3}$ Pa·s, from the view point of its filling property for patterns having a high aspect ratio, coatability, and filtration property. The viscosity of less than $1\times10^{-3}$ Pa·s causes not only less coatability resulting in difficulty in obtaining an uniform applied coating but also deterioration of temporal stability of the applied coating. On the other hand, the viscosity of more than $100\times10^{-3}$ Pa·s causes an inferior filling property resulting in non-uniform filling for patterns having a high aspect ratio, a stringing phenomenon upon application, and difficulty in obtaining an uniform applied coating by using a small dropping amount of the composition owing to its insufficient spreading on the substrate surface. In addition, the transmissivity of the composition through a filter is often poor.

The composition to be used in the present invention contains the above-mentioned compounds (1) and (2), and it can be combined, as required, with additional compounds. These materials with which it can be combined are described as follows. The components other than the compounds (1) and (2) is preferably not more than 10%, more preferably not more than 5%, still more preferably not more than 3% by mass to the total mass of the whole composition.

(3) Acid, Acid-Generating Compound, Base, or Base-Generating Compound

Further, an acid, acid-generating compound, base, or base-generating compound may be used for the gap filling composition according to the present invention. Any compound conventionally known as an acid, acid-generating compound, base, or base-generating compound may be used as such a compound. Such a compound has an effect to enhance thermal decomposition of the polymer (I). Examples of the acid, acid-generating compound, base, or base-generating compound include a compound selected from the group consisting of primary amine, secondary amine, tertiary amine, quaternary ammonium salt, cyclic amine, nitrogen-containing heterocyclic compound, sulfonic acid, carboxylic acid, carboxylic amide, and a salt thereof.

For example, they include the compounds represented by the following structure,

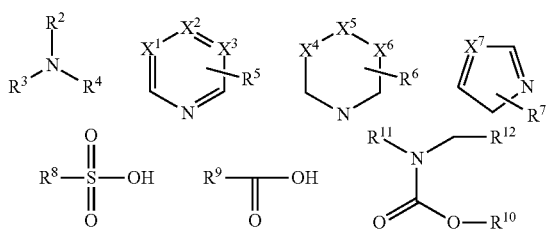

(wherein
each $R^2$, $R^3$, and $R^4$ independently represents hydrogen or alkyl of 1 to 6 carbon atoms, provided that $R^2$ to $R^4$ are not simultaneously hydrogen,
each $X^1$, $X^2$, and $X^3$ independently represents carbon or nitrogen,
$R^5$ represents hydrogen, alkyl having 1 to 5 carbon atoms, or haloalkyl having 1 to 5 carbon atoms, each $X^4$ and $X^6$ independently represents carbon or nitrogen;
$X^5$ represents carbon, nitrogen, or a single bond,
$R^6$ represents hydrogen, alkyl having 1 to 5 carbon atoms, or haloalkyl having 1 to 5 carbon atoms,
$X^7$ represents carbon or nitrogen,
$R^7$ represents hydrogen, alkyl having 1 to 5 carbon atoms, or haloalkyl having 1 to 5 carbon atoms,
$R^8$ represents hydrogen, hydroxy, alkyl having 1 to 5 carbon atoms, or haloalkyl having 1 to 5 carbon atoms,
$R^9$ represents hydrogen, alkyl having 1 to 5 carbon atoms, or haloalkyl having 1 to 5 carbon atoms,
each $R^{10}$, $R^{11}$, and $R^{12}$ independently represents hydrogen, alkyl having 1 to 5 carbon atoms, or haloalkyl having 1 to 5 carbon atoms, and $R^{11}$ and $R^{12}$ together may form a ring).

Specifically, 4-dimethylaminopyridine, tributylamine, trifluoromethanesulfonic acid, 1-tert-butoxycarbonylpirrolidine, sulfuric acid, and so on are included.

The mass ratios of the gap filling compound, the solvent, and the acid, acid-generating compound, base, or base-generating compound to the total mass of the gap filling composition according to the present invention are preferably not less than 2% and not more than 30%, not less than 70% and not more than 98%, and equal with or more than 0% and not more than 10%, and more preferably not less than 2% and not more than 20%, not less than 80% and not more than 98%, and equal with or more than 0% and not more than 5%, respectively.

(4) Other Additives

Further, surfactants can be used, as required, in the gap filling composition of the present invention in order to improve its coatability. Any surfactant can be used. Examples of the surfactant which can be used to the present invention include (A) anionic surfactants, (B) cationic surfactants, (C) non-ionic surfactants, and specifically, preferable are (A) alkyl sulfonate, alkylbenzenesulfonic acid, and alkyl benzene sulfonate, (B) lauryl pyridinium chloride and lauryl methyl ammonium chloride, and (C) polyoxyethylene octyl ether, polyoxyethylene lauryl ether, and polyoxyethylene acetylenic glycol ether. For these surfactants, an example of the non-ionic surfactants, such as non-ionic alkyl ether surfactant from Nippon Nyukazai Co., Ltd. is commercially available.

The gap filling composition according to the present invention may further include fungicide, an antimicrobial agent, preservative, and/or an antifungal agent. These drugs are used to prevent an aged gap filling composition from growth of bacteria or fungi therein. Examples of these drugs include alcohol such as phenoxyethanol and isothiazolone. BESTCIDE (trade name) commercially available from Nippon Soda Co., Ltd. is a particularly effective preservative, antifungal agent, and fungicide.

The gap filling composition according to the present invention can use any other additives so long as they do not impair the effect of the present invention. One example of such additives is plasticizer, such as ethylene glycol, glycerin, and triethyl glycol. In addition, for example, leveling agents can also be used.

These additives typically do not impact the performance of the gap filling composition, and their content is considered to be usually not more than 10%, preferably not more than 5%, and more preferably not more than 3% by mass, based on the total mass of the gap filling composition.

Pattern Forming Method A

A fine pattern forming method according to the first embodiment of the present invention (for simplicity, hereinafter also referred to as pattern forming method A or method A) will now be described with reference to drawings. The pattern forming method A according to the present invention applies a composition containing a certain polymer after gap formation in contrast to conventionally known pattern forming methods, but a gap formation method can be optionally selected from conventionally known methods. Such gap formation method is described also in, for example, Non-patent literature 1.

[Pre-Processing]

It is indispensable for the fine pattern forming method A according to the present invention to previously form gaps to which the gap filling composition is applied, but various combinations of pre-processing can be antecedent to the gap formation.

FIG. 1 (*a*) shows a substrate 1, on which is formed an applied carbon coating (applied C coating, also referred to as Spin On Carbon coating) layer 2, on which is formed a silicon containing anti-reflective coating (Si-ARC, also referred to as Spin On Glass coating) layer 3, on which are formed resist patterns 4. Here, the substrate 1 corresponds to a layer to be processed. In the fine pattern forming method A according to the present invention, a layer to be processed is preferably a substrate.

The substrate to be used is not particularly limited, but it is, for example, a semiconductor substrate (for example, silicon wafer), or a glass substrate such as LCD and PDP. The substrate may include conductive films, wires, and semiconductors formed thereon. The applied carbon coating can be applied by a conventionally known method such as spin coat and then pre-baked, to be shaped into a film. Alternatively, it may be shaped into a film by CVD (Chemical Vapor Deposition) or ALD (Atomic Layer Deposition). The silicon-containing anti-reflective coating layer can be applied by spin coat and then pre-baked, to be shaped into a film. Such a silicon-containing anti-reflective coating layer can improve the cross-sectional shape and exposure margin of resist patterns. Further, since the silicon-containing anti-reflective coating layer is used as an etching mask, it preferably has a property such as etching resistivity.

The resist pattern formation is carried out by applying photoresist on, for example, a silicon-containing anti-reflective coating layer by using a conventionally known method such as spin coat, pre-baking (for example, at a bake temperature of not less than 70° C. and not more than 140° C. for about 1 minute), then exposing the sample with ultraviolet rays such as g-line and i-line, far ultraviolet rays such as KrF excimer laser and ArF excimer laser lights, X-ray, electron beam, and so on, and then as required, performing post exposure bake (PEB) (for example, at bake temperature of not less than 50° C. and not more than 140° C.), followed by development by using a development method such as paddle development, to shape resist patterns. The resist development is carried out usually by using an alkaline developer. An aqueous solution or aqueous liquid, such as sodium hydroxide, tetramethylammonium hydroxide (TMAH) is used as the alkaline developer. After the development processing, the resist patterns are rinsed (cleaned) by using a rinse solution. In this instance, a resist composition to be used is not particularly limited, and either positive or negative resist can be used for the pattern forming method of the present invention. Resist patterns may be formed directly on a substrate or indirectly above a substrate on which is formed any other conventionally known layers such as an anti-reflective coating layer and a hard mask layer, so long as the effect of the present invention is not impaired. Specifically, on the substrate is formed a combination of a silicon-containing anti-reflective coating layer and an applied carbon coating as described above, a single silicon-containing anti-reflective coating layer, or an anti-reflective coating layer, and then resist patterns can be formed thereon. In the formation of applied carbon coating layer, plural applied carbon coatings may also be formed.

FIG. 1 (*b*) shows silicon-containing anti-reflective coating layer patterns formed through etching the silicon-containing anti-reflective coating layer by using the resist patterns as a mask. This etching may be either dry etching or wet etching. Gas species for dry etching are not especially limited, but Freon-based gas is usually used.

FIG. 1 (*c*) shows applied carbon coating layer patterns formed through etching the applied carbon coating layer by using the silicon-containing anti-reflective coating layer patterns as a mask. This etching may be either dry etching or wet etching. Gas species for dry etching are not especially limited, but oxygen-based and/or nitrogen-based gas is usually used. For example, a suitable pattern forming method may be shaping resist patterns by using ArF excimer laser light as an exposure source and dry-etching in later processes. Those skilled in the art can select an optimum processing method depending on pattern size.

[Step (A1)]

FIG. 1 (d) shows gaps 5 formed through etching the substrate using the applied carbon coating layer as a mask. The etching carried out prior to FIG. 1 (d) may be either dry etching or wet etching. Gas species for dry etching are not particularly limited, but Freon-based gas is usually used.

[Step (A2)]

FIG. 1(e) shows the formed gaps filled with liquid 6. This liquid is a liquid used for cleaning or rinse treatment by using liquid chemicals to treat residues in the case of dry-etching. In the case of wet etching, this liquid is liquid chemicals used for wet etching or liquid for subsequent rinse treatment as required.

This liquid, when spin-dried as is, may cause pattern collapse for patterns having a high aspect ratio owing to an influence of the surface tension of the liquid. Thus, in the method A according to the present invention, the above-described liquid is replaced through filling the gap filling composition according to the present invention.

Figure 2:
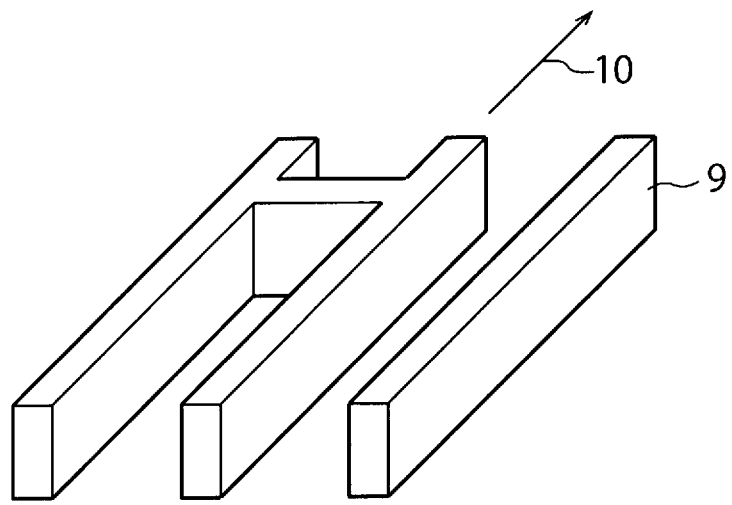
FIG. 2 is an explanatory drawing of topographies between gaps in a conventional pattern forming method.
Figure 2:
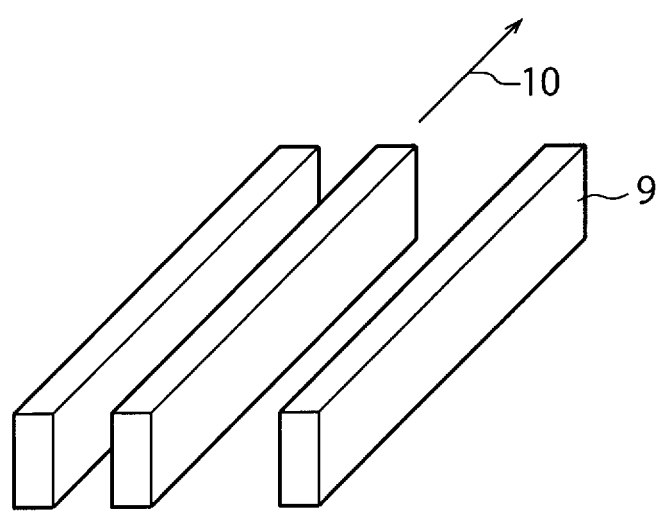

Effects of the present invention are expected as follows, but it does not at all limit the present invention. In general, when rinse treatment is carried out, a substrate is rotated to remove, by centrifugal force (spin dry), rinsing solution attached to the substrate surface. In contrast to this, the present inventors have found that, on a substrate having complex trenches (gaps) formed thereon by etching, the width, shape (for example, opening or closing of the far end from the wafer center), or depth of the trenches fluctuates, and may cause non-uniform evaporation of the rinse solution when the rinse solution is removed and dried by centrifugal force. For example, as shown in FIG. 2(a), when the left inter-pattern region is closed in a centrifugal direction 10 from a wafer center and the right inter-pattern region is opened toward the outer direction within the patterns 9, rinse solution remaining in the right region disappears faster during spin dry. Further, as shown in FIG. 2(b), the gap between the left patterns is narrower and that between the right patterns is wider within the patterns 9 as viewed from the wafer center, rinse solution remaining within the right gap disappears faster during spin dry. Even when the surface tension of the liquid is reduced, patterns having a high aspect ratio may collapse owing to such effects.

In the present invention, a solution of an antecedent process is replaced by the filled gap filling composition, which is then removed through heating, and this is expected to enable obtaining patterns free from impurities and preventing the patterns from pattern collapse. Patent literature 1 uses polymer as a gap filling composition for resist patterns, but the polymer described in patent literature 1 is thought to damage the resist owing to high temperature applied for decomposing and vaporizing the polymer.

It should be noted that steps (A1) and (A2) may not be necessarily independently performed, but may be performed simultaneously. Specifically, when the gaps are formed on a substrate by wet-etching, gap-forming by wet-etching and gap-filling with wet-etching solution may be performed simultaneously.

[Step (A3)]

FIG. 1 (f) shows a composition 7 including a polymer, which is filled into gaps. A composition including a polymer having a mass average molecular weight of not less than 1,000 and not more than 500,000 (for simplicity, it may be hereinafter also referred to as "composition") is applied while liquid remains as shown in FIG. 1 (d). The composition is preferably a composition including a polymer (I) containing repeating units represented by the general formula (i) described above. The composition is typically the gap filling composition according to the present invention. The molecular weight of the polymer (I) contained in the composition is preferably a mass average molecular weight of not less than 10,000 and not more than 500,000, most preferably not less than 10,000 and not more than 30,000. A method of applying the composition is not limited, but it can be carried out by, for example, a method of dropping the composition onto a substrate surface while rotating the substrate at not less than 1 rpm and not more than 400 rpm, a method of dropping the composition onto the substrate at a stationary state and then rotating the substrate at not less than 1 rpm and not more than 400 rpm to spread the composition, a method of dipping the substrate into the composition, or aerosol or spraying of the composition. Among them preferable are the method of dropping a composition onto a substrate surface while rotating the substrate at not less than 1 rpm and not more than 400 rpm, or the method of dropping the composition on the substrate at a stationary state and then rotating the substrate at not less than 1 rpm and not more than 400 rpm to spread the composition. In this instance, at least some of the liquid is replaced by the composition, which is filled into gaps. In order for the effect of the present invention to be exhibited sufficiently, the substitution is preferably carried out sufficiently.

In addition, in the pattern forming method according to the present invention, the liquid may be replaced, before filling of the composition, by a solvent into which the composition is soluble. Such a solvent can be suitably selected depending on the composition.

After the above-described step, the substrate may be rotated at not less than 500 rpm and not more than 5,000 rpm. Surplus solvent in the present composition is removed from the substrate by this rotation, but at least some of the polymer contained in the composition remains. Since all in the composition are not removed from inter-pattern regions, pattern collapse is thought to be prevented.

[Step (A4)]

FIG. 1 (g) shows a pattern formed after the removal of the filled composition. The removal of the composition is carried out by heating. The heating temperature is not particularly limited, but it is preferably not less than 100° C. and not more than 500° C., more preferably not less than 150° C. and not more than 300° C., and still more preferably not less than 180° C. and not more than 250° C. The heating time is not particularly limited, but it is preferably not less than 30 seconds and not more than 300 seconds, more preferably not less than 30 seconds and not more than 240 seconds, and still more preferably not less than 30 seconds and not more than 180 seconds.

Now, as shown in FIG. 1 (g), the line width of the pattern formed on the substrate is defined as x, and the length thereof in a depth direction is y. The aspect ratio of the pattern is represented by y/x. In particular, the pattern forming method A according to the present invention can effectively reduce pattern collapse also for fine patterns having a high aspect ratio. From the viewpoint of the dimension of formed patterns, y is generally not less than 0.05 μm and not more than 6 μm, preferably not less than 0.01 μm and not more than 2 μm, and more preferably not less than 0.3 μm and not more than 1 μm. The aspect ratio is, preferably not less than 5 and not more than 25, and more preferably not less than 15 and not more than 22.

[Post-Processing]

The formed pattern is then, as required, further subjected to post-processings such as processing the substrate and forming circuits, to form elements. These post-processings can be carried out by using any conventionally known method. After the element formation, the substrate is cut into chips, connected to lead frames, and packaged in resin, as required. In the present invention, this packaged chip will be referred to as a device. Suitably, the device is, for example, semiconductor.

Pattern Forming Method B

A fine pattern forming method according to the second embodiment of the present invention (for simplicity, it may be hereinafter also referred to as pattern forming method B or method B) will now be described with reference to drawings. The pattern forming method 2 according to the present invention is different from the method A, for example, in that the resist pattern is a target to be prevented from pattern collapse by means of the gap filling composition, and in that removal of the gap filling composition and etching of the layer to be processed which underlies the resist pattern are performed simultaneously by dry-etching. Here, a description will be made for an example in which the applied carbon coating is used as a layer to be processed.

[Pre-Processing]

The fine pattern forming method 2 according to the present invention forms a resist film on a layer to be processed, and pre-processing can be antecedent to the gap formation. Generally, a layer to be processed is formed on a substrate. Any substrate can be used, as in the method A. The substrate may include conductive films, wires, and semiconductors, or patterns, formed on its surface.

Figure 3:
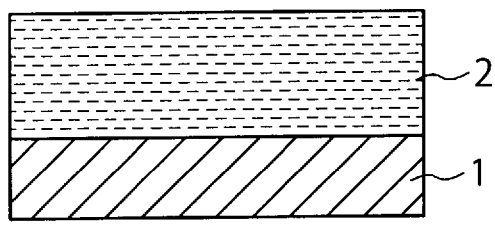
FIG. 3 is an explanatory drawing of a pattern forming method according to the second embodiment of the present invention.
Figure 3:
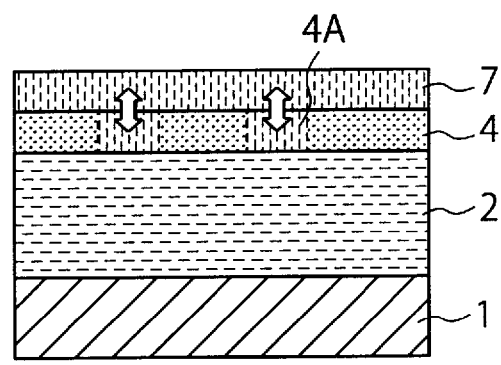
Figure 3:
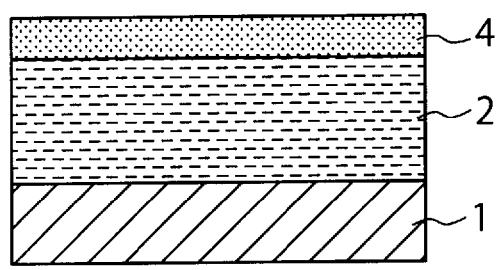
Figure 3:
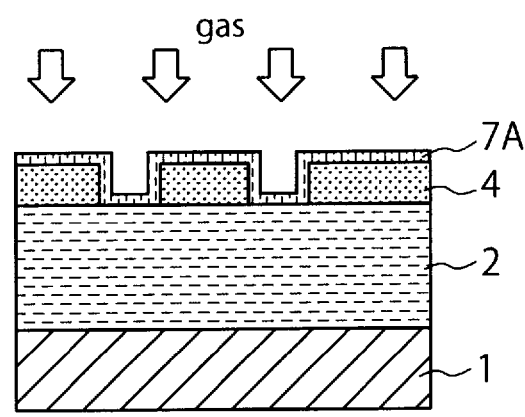
Figure 3:
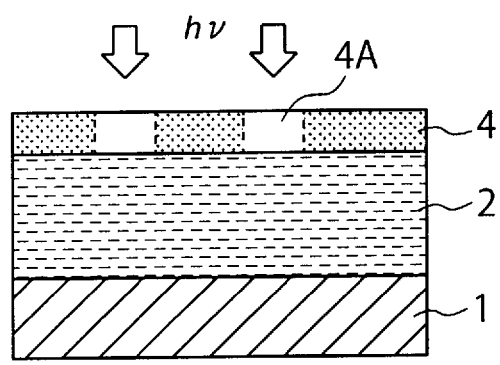
Figure 3:
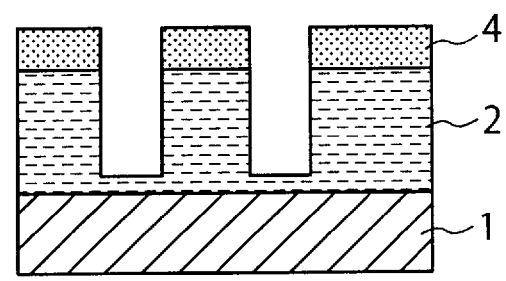

A layer to be processed may be a substrate per se, or may be separately formed on a substrate. In method B, as described below, since the etching rate of the resist film is preferably lower than the etching rate of the layer to be processed, it is preferred to form a layer to be processed with relatively lower etching rate on the surface of the substrate 1 as a support. FIG. 3(a) shows a structure having, as a layer to be processed, an applied carbon coating formed on a substrate 1 which is a support.

Materials for such a processed layer may be arbitrarily selected depending on purposes, but includes an applied carbon coating and a layer made of an organic resin material. The applied carbon coating is particularly preferred because whose etching rate has a desirable relationship with that of a resist film as described below.

The applied carbon film can be formed by a method such as spin coating, CVD, or ALD, as described in method A.

[Step (B1)]

The resist film 4 is formed, for example, by applying a photoresist onto a layer to be processed 2 by a conventionally known method such as spin coating, followed by prebaking as needed (FIG. 3(b)). The thickness of the photoresist film formed is not particularly limited, but generally not less than 1 nm and not more than 100 nm, preferably not less than 5 nm and not more than 50 nm.

Here, the photoresist is preferably selected depending on the types of a layer to be processed. That is, it is necessary for the photoresist film 4 to have an etching rate lower than that of a layer to be processed 2. As described below, since the layer to be processed 2 is processed by dry-etching with a mask derived from the resist film, the etching rate of the resist film is selected to be not more than 0.5 times, preferably not more than 0.2 times as large as the etching rate of the processed layer so that the resist film 4 may sufficiently function as the mask.

The resist compositions which can form a resist film having relatively lower etching rate may be selected from any composition conventionally known, and also include metal-containing resist compositions containing inorganic materials, particularly metals or metal oxides. Such resist compositions may also be prepared by combining a metal oxide, a photo-acid-generating agent, a solvent, a dispersant, a resin, and other additives.

Since inorganic materials such as metals or metal oxides may generally exist in a state of being dispersed in the composition, dry-etching rate is relatively lower. Inorganic materials are preferably metal oxides from the viewpoint of preventing metal contamination. Inorganic materials are preferably selected from zirconium oxide, aluminum oxide, titanium oxide, silicon oxide, and so on. Zirconium oxide is particularly preferred. In addition, since it is preferred that such a metal oxide stably exist in the composition, its particle size is preferably small. Specifically, the average particle size (average primary particle size) of the metal oxide is preferably not more than 30 nm, and more preferably not more than 10 nm. The average particle size may be measured, for example, by means of a transmission-type electron microscope. Further, the higher the content of the metal oxide contained in the resist composition, the lower the dry-etching rate tends to be, whereas the lower the content of the metal, the higher the stability of the resist composition tends to be. Accordingly, the content of the metal oxide is preferably not less than 0.1% and not more than 30%, and more preferably not less than 0.5% and not more than 10% based on the total weight of the resist composition. After the resist composition is applied, excess solvent may be removed by pre-baking as needed.

[Step (B2)]

Subsequently, the formed resist film is exposed. Any radiation may be used for exposure. However, it is preferable to use rays of short wavelength for the method 2. For example, extreme ultraviolet ray (EUV), electron beam, X-ray, and so on may be used. Exposure may be performed using photo masks or the like. However, it is not limited thereto and may be performed using other method such as electron beam lithography. Such exposure forms a latent image 4A in the resist film (FIG. 3(c)). Such latent image 4A may be soluble in a solvent contained in the gap filling composition, whereas an unexposed portion is insoluble in a solvent. Therefore, the exposed resist film has been latently patterned and the latent image 4A is a latent gap.

[Step (B3)]

The exposed resist film is subjected to PEB as needed, and then contacted with a gap filling composition 7. Methods for contact is not particularly limited and includes a method to drop a composition onto the surface of a resist film, a method to apply a composition onto the surface of a resist film, for example, with a brush, a method to immerse a resist film into a composition, and so on. Among them, a method to drop a composition onto the surface of a resist film is preferred because such a method hardly damages the surface of the resist film. In this case, the composition may be dropped onto the resist film rotated, for example, by using a spin coater to evenly coat the surface of the resist film with the composition. When the resist film is brought into contact with the composition in this way, the latent image formed upon exposure is dissolved in a solvent contained in the composition 7. Then, the composition 7 will enter the dissolved latent image 4A, that is, the latent gap (FIG. 3(d)). In other ward, the exposed resist film is developed with the solvent contained in the gap filling composition.

In an embodiment of the present invention, the pattern forming method B can utilize the above-mentioned gap filling composition according to the present invention.

Moreover, in another embodiment of the present invention, a polymer other than formula (I) may be used for the composition according to the present invention in the pattern forming method B. Examples of such polymer include, for example, a polymer having hydroxyl or carboxyl bonded to the side chain of the hydrocarbon chain thereof. Specific examples of such polymer include methyl polymethacrylate, methyl polyacrylate, ethyl polymethacrylate, ethyl polyacrylate, polyvinyl alcohol, and so on. The composition utilized in the pattern forming method B of the present invention more preferably contains, as a polymer, polypropylene carbonate, polyethylene carbonate, or methyl polymethacrylate. When these polymers are used, their mass average molecular weight is necessarily not less than 1,000 and not more than 500,000, preferably not less than 3,000 and not more than 300,000, and more preferably not less than 8,000 and not more than 30,000, from the viewpoint of etching grade in addition to filling property and thermal degradability.

In other word, another embodiment of the present invention includes a method which comprises a step of forming a resist film; a step of exposing the resist film; a step of bringing a composition containing the polymer into contact with the resist film; and a step of dry-etching the resist film and the layer to be processed; wherein the etching rate of the resist film is not more than 0.5 times as large as the etching rate of the layer to be processed.

[Step (B4)]

A solvent remaining on the surface of the resist film may be removed by heating, as needed. In this case, heating is not for the purpose of removing the gap filling composition, and carried out at a relatively lower temperature, for example, lower than 100° C. FIG. 3(e) shows the surface of the resist film wherein the solvent of the composition is removed and only a solid content 7A contained in the composition is deposited thereon.

This resist film is subjected to dry-etching. Firstly, the solid content in the gap filling composition on the surface of the resist film is removed by such dry-etching. In other word, removal of the gap filling composition is performed by dry-etching in the method B. As a result, a patterned resist film is left on the surface of the layer to be processed 2. Since the etching rate of the resist film is relatively lower under such dry-etching conditions, dry-etching is continued to process the layer to be processed by dry-etching (FIG. 3(f)).

Gas utilized for dry-etching is not particularly limited, and oxygen-containing gas is preferably used. Particularly, it is easy to select an advantageous etching rate because the resist film is highly resistant against etching with oxygen-containing gas when a metal-containing resist composition is used for formation of the resist film.

Such a method hardly results in pattern collapse even when the pattern formed on the resist or layer to be processed has high aspect ratio. Accordingly, the method 2 is also effective for forming patterns of high aspect ratio. The aspect ratio of the pattern to be formed is, preferably not less than 5 and not more than 25, and more preferably not less than 15 and not more than 22.

[Post-Processing]

The formed pattern is then, as required, further subjected to post-processings such as processing the substrate and forming circuits, to form elements. These post-processings can be carried out by using any conventionally known method. After the element formation, the substrate is cut into chips, which are connected to lead frames, and packaged in resin, as required. In the present invention, these packaged chips will be referred to as a device. Suitably, the device is, for example, semiconductor.

The present invention will be described as follows by using Examples. Embodiments of the present invention are not limited to these Examples.

Examples 101 to 104, Comparative Examples 101, 102

[Evaluation of Solubility]

The polymers (I) and solvents listed in the following Table 1 were mixed and stirred so that the mass ratios to be 10% and 90% to the total mass of the composition, respectively. Then, evaluation of solubility was conducted. Evaluation criteria were as follows. Evaluation results were as listed in Table 1.

A: transparent solution after stirred

B: dispersed uniformly after stirred, but turbidity was observed.

C: not dissolved after stirred, and deposit was observed.

[Evaluation of Coatability]

Subsequently, about 10 cc of the above-mentioned stirred composition was dropped onto a silicon substrate, then applied while the rotating was rotated at 1,000 rpm. Then, the surface of the substrate was observed, and the coatability of the composition was evaluated. Evaluation criteria of coatability were as follows and obtained results were as listed in Table 1.

A: uniform coating was formed

B: coating was formed but contained plaque

C: coating was not formed

[Evaluation of Remaining Coating]

After the application, the coating was pre-baked at 110° C. for 90 s, and its film thickness was measured. Further, the substrate was baked at 200° C. for 180 s, at 250° C. for 180 s, and at 300° C. for 180 s, and the film thickness after respective bakings was measured. Obtained results were as in Table 1.

TABLE 1

| | Composition | | Solubility | Coat-ability | 110° C./90 s Film thickness(nm) | 200° C./180 s Remaining coating(nm) | 250° C./180 s Remaining coating(nm) | 300° C./180 s Remaining coating(nm) |
| --- | --- | --- | --- | --- | --- | --- | --- | --- |
| | Polymer (I) | Solvent | | | | | | |
| Example 101 | PPC | PGMEA | A | A | 805 | 795 | 650 | 0 |
| Example 102 | PEC | PGMEA | A | A | 803 | 794 | 700 | 0 |
| Example 103 | PPG | Water | A | A | 804 | 798 | 730 | 0 |
| Example 104 | PEG | Water | A | A | 806 | 797 | 760 | 0 |

TABLE 1-continued

| | Composition | | Solubility | Coatability | 110° C./90 s Film thickness(nm) | 200° C./180 s Remaining coating(nm) | 250° C./180 s Remaining coating(nm) | 300° C./180 s Remaining coating(nm) |
|---|---|---|---|---|---|---|---|---|
| | Polymer (I) | Solvent | | | | | | |
| Comparative Example 101 | Polyallyl alcohol | Water | A | A | 803 | 798 | 795 | 795 |
| Comparative Example 102 | Polyphthalaldehyde | PGMEA | A | A | 805 | 797 | 790 | 790 |

In Table 1,
PPC: polypropylene carbonate Mw 200,000
PEC: polyethylene carbonate Mw 4,000
PPG: polypropylene glycol Mw 5,000
PEG: polyethylene glycol Mw 150,000
Polyallyl alcohol Mw 12,000
Polyphthalaldehyde Mw 30,000

The above definitions apply to the following tables.
[Evaluation of Collapse Prevention]

To an 8 inch silicon substrate was applied U98 Ctg 85 (from Merck Performance Materials G.K., hereinafter abbreviated as Merck) by a spin coater (MK-VIII from Tokyo Electron Limited), pre-baked at 250° C. for 180 seconds on a hot plate, to form a carbon coating layer of 200 nm in film thickness. AZSH24H (from Merck) was applied to the sample and pre-baked at 120° C. for 60 seconds on a hot plate, to form a silicon-containing anti-reflective coating layer of 35 nm in film thickness. AZ AX2110P (from Merck) which is an ArF resist was further applied to the sample and pre-baked at 110° C. for 60 seconds on the hot plate, to form a resist layer of 120 nm in film thickness. The obtained substrate was exposed by an ArF exposure apparatus (NSR-S306C (trade name) from Nikon Corporation), heated under a condition of 110° C./60 seconds, developed by using a 2.38% TMAH aqueous solution, and then rinsed in pure water, to fabricate a substrate including a resist line and space pattern of 110 nm (1:1).

The obtained resist pattern was used as a mask to dry-etch the silicon-containing anti-reflective coating layer by $CF_4$ plasma for 6 seconds (25° C., 5 Pa, 200 W), to yield a silicon-containing anti-reflective coating layer pattern. Then, the silicon-containing anti-reflective coating layer pattern was used as a mask to dry-etch the applied carbon coating layer for 30 seconds (25° C., 0.67 Pa, 100 W) by oxygen and nitrogen (3:7) plasma, to yield an applied carbon coating layer pattern. Then, the applied carbon coating layer pattern as a mask and a solution heated to 85° C., which was prepared so that the content of potassium hydroxide to be 25% by mass in a solvent of IPA:water (1:4), were used to wet-etch the silicon substrate (etching rate, about 1 micro m/60 s) for 60 s, to yield a silicon substrate including gaps formed thereon which had an aspect ratio of about 9. Subsequently, the substrate was rinsed with water for 60 seconds, and further with IPA for 60 seconds. In this instance, IPA remained between the gaps.

Then, the gap filling composition which was prepared so that the mass ratios of the polymer (I) and the solvent were respectively 10% and 90% of the total mass of the composition was replaced with IPA, and dropped to fill the gaps while the substrate was rotated at 10 rpm. Then, the substrate was rotated at 1,000 rpm for 20 seconds. Then, the substrate was heated at 400° C. for 180 seconds, followed by counting the number of collapsed patterns. A pattern collapse rate was defined as the number of collapsed patterns divided by that in the case where the composition contained water alone.

The results obtained using the compositions of Examples 101, 102, 103, and 104 were 4%, 5%, 3%, and 5%, respectively.

Examples 201A to 204C, Comparative Example 203, 204

[Evaluation of Solubility, Evaluation of Coatability]

The polymer (I), and the acid, acid-generating compound, base, or base-generating compound, and the solvent listed in the following Table 2 were mixed and stirred so that the mass ratios to be respectively 10%, 1%, and 89% to the total mass of the composition. Then, evaluation of solubility was conducted. Subsequently, about 10 cc of the above-mentioned stirred composition was dropped onto a silicon substrate, then applied while the substrate was rotated at 1,000 rpm. Then, the surface of the substrate was observed, and the coatability of the composition was evaluated. Evaluation criteria were as described above and obtained results were as listed in Table 3.

[Evaluation of Remaining Coating]

After the application, the coating was pre-baked at 110° C. for 90 s, and its film thickness was measured. Further, the substrate was baked at 180° C. for 180 s, at 200° C. for 180 s, and at 230° C. for 180 s, and the film thickness after respective bakings was measured. Obtained results were as in Table 3.

TABLE 2

| | Composition | | |
|---|---|---|---|
| | Polymer (I) | Acid, acid generating compound, basae, or base generating compound | Solvent |
| Example 201A | PPC | DMAP | PGMEA |
| Example 201B | | Tributylamine | PGMEA |
| Example 202A | PEC | DMAP | PGMEA |
| Example 202B | | Tributylamine | PGMEA |
| Example 202C | | TBCP | PGMEA |
| Example 203A | PPG | DMAP | Water |
| Example 203B | | Tributylamine | Water |
| Example 203C | | Trifluoromethanesulfonic acid | Water |
| Example 204A | PEG | DMAP | Water |
| Example 204B | | Tributylamine | Water |
| Example 204C | | Trifluoromethanesulfonic acid | Water |

In Table 2,
DMAP: 4-dimethylaminopyridine
TBCP: 1-tert-butoxycarbonyl pyrrolidine The above definitions apply to the following tables.

TABLE 3

|  | Solubility | Coatability | 110° C./90 s Film thickness (nm) | 180° C./180 s Remaining coating (nm) | 200° C./180 s Remaining coating (nm) | 230° C./180 s Remaining coating (nm) | 300° C./180 s Remaining coating (nm) |
|---|---|---|---|---|---|---|---|
| Example 201A | A | A | 803 | 120 | 0 | — | 0 |
| Example 201B | A | A | 809 | 350 | 50 | 0 | 0 |
| Example 202A | A | A | 801 | 150 | 0 | 0 | 0 |
| Example 202B | A | A | 805 | 320 | 32 | 0 | 0 |
| Example 202C | A | A | 808 | 780 | 570 | 298 | 0 |
| Example 203A | A | A | 800 | 420 | 210 | 20 | 0 |
| Example 203B | B | B | 805 | 390 | 240 | 30 | 0 |
| Example 203C | A | A | 808 | 97 | 0 | 0 | 0 |
| Example 204A | A | A | 802 | 310 | 180 | 50 | 0 |
| Example 204B | B | B | 808 | 350 | 210 | 10 | 0 |
| Example 204C | A | A | 805 | 80 | 0 | 0 | 0 |

These results and the results listed in Table 1 indicate that the remaining coating is decreased at lower temperature with the composition containing acid, an acid-generating compound, base, or a base-generating compound.

[Evaluation of Collapse Prevention]

The number of collapsed patterns was counted in the same manner as in the evaluation of the above-described collapse prevention, except that the polymer (I), and the acid, acid-generating compound, base, or base-generating compound, and the solvent listed in the following Table 4 were used so that the mass ratios to be respectively 10%, 1%, and 89% to the total mass of the composition, and except that after the gap filling composition was dropped onto a substrate, the substrate was heated at 230° C. for 180 seconds. Comparative Examples 203 and 204, as in conventional rinse treatment, were not heated and were dried by spin dry. A pattern collapse rate was defined as the number of collapsed patterns divided by that in the case of water in Comparative Example 204. In this case, remaining coating was not observed between gaps.

Comparative Example 301

Firstly, the following materials were compounded to prepare a metal-containing photoresist composition:

| | |
|---|---|
| Zirconium oxide nanoparticle (average particle size 3 nm) | 2.00 wt % |
| o-Toluic acid | 10.80 wt % |
| 4-Methylphenyldiphenylsulfonium nonafluorobutane sulfonate | 0.40 wt % |
| Triethanolamine | 0.02 wt % |
| PGMEA | 86.78 wt % |

The obtained metal-containing photoresist composition was applied onto an 8-inch silicon substrate rotated at 1,500 rpm by a spin coater, and then heated at 90° C. for 60 seconds, to form a resist film of 90 nm in film thickness. This resist film was exposed using an electron beam lithography system (ELS-F125 (trade name) manufactured by ELIONIX) and developed with butyl acetate as a developer. An observation of the pattern after development by a scanning electron microscope confirmed metal-containing pat-

TABLE 4

| | Composition | | | |
|---|---|---|---|---|
| | Polymer (I) | Acid, acid generating compound, basae, or base generating compound | Solvent | Collapse Prevention |
| Example 201A | PPC | DMAP | PGMEA | 5% |
| Example 201B |  | Tributylamine | PGMEA | 7% |
| Example 202A | PEC | DMAP | PGMEA | 6% |
| Example 202B |  | Tributylamine | PGMEA | 9% |
| Example 203A | PPG | DMAP | Water | 4% |
| Example 203C |  | Trifluoromethanesulfonic acid | Water | 3% |
| Example 204A | PEG | DMAP | Water | 5% |
| Example 204C |  | Trifluoromethanesulfonic acid | Water | 4% |
| Comparative Example 203 |  | SPC-116 |  | 80% |
| Comparative Example 204 |  | Water |  | 100% |

In Table 4, SPC-116 is trade name of a rinsing solution for collapse prevention manufactured by Merck.

terns with line width of 15 nm and space of 20 nm. However, these patterns were impractical with many collapsed patterns.

Examples 301 to 303

Firstly, the polymers (I), the surfactant, and the solvent listed in the following Table 5 were mixed and dissolved to prepare a gap filling composition.

Then, a resist film was formed in the same manner as in Comparative Example 301, and exposed using an electron beam lithography system. Onto the center of the substrate was slowly dropped 50 cc of the gap filling composition while the exposed resist film was rotated at 100 rpm. By this operation the unexposed portion of the resist film was removed and the gap filling composition entered the portion where the resist was removed. Thus, the whole surface of the pattern was covered with the composition. Further, the solvent was removed by heating at 90° C. for 60 seconds.

Subsequently, the resist film was placed in a dry-etching system, and subjected to etching with plasma (oxygen: nitrogen=3:7) for 30 seconds. The etching conditions were as follows: substrate temperature, 25° C.; pressure, 0.67 Pa; input power, 100 W. The obtained pattern was observed by a scanning electron microscope and the results are listed in Table 5.

TABLE 5

| | Composition | | | Collapsed |
|---|---|---|---|---|
| | Polymer (I) | Surfactant | Solvent | pattern |
| Comparative Example 301 | — | — | — | Many |
| Example 301 | PPC 3 wt % | — | BA 97 wt % | None |
| Example 302 | PEC 5 wt % | Dinonylnaphthalene sulfonic acid ammonium 0.1 wt % | PGMEA 94.9 wt % | None |
| Example 303 | PMMA 8 wt % | — | BA 92 wt % | None |

In table 5,
PMMA: Methyl polymethacrylate Mw 8,290
BA: Butyl acetate

In addition, the evaluation was also conducted for a sample in which an applied carbon coating was formed on the surface of a substrate before coating with a metal-containing resist film. To a silicon substrate was applied AZ U98 Ctg 85 (from Merck) by a spin coater, pre-baked at 250° C. for 180 seconds on a hot plate, to form a underlying carbon coating layer of 300 nm in film thickness. In this case, dry-etching hardly removed the resist film, and a pattern was formed with the gap filling composition, in which the applied carbon coating was removed, in the portion where the resist film was removed. In this case, using the compositions according to Examples 301 to 303, good patterns without pattern collapse were obtained.

REFERENCE SIGNS LIST 1. substrate
2. applied carbon film layer
3. silicon-containing anti-reflective film layer
4. resist pattern
5. gap
6. liquid
7. composition according to invention
8. pattern
9. pattern
10. centrifugal direction

The invention claimed is:

1. A pattern forming method comprising:
   (A1) a step of etching a layer to be processed to form a gap;
   (A2) a step of filling a liquid into the gap;
   (A3) a step of filling a composition comprising a polymer selected from the group consisting of polyethylene glycol, polypropylene glycol, polypropylene carbonate, polyethylene carbonate, polyethylene propylene glycol, and combination of two or more of these polymers and having a mass average molecular weight of not less than 1,000 and not more than 500,000 into said gap to replace said liquid; and
   (A4) a step of removing said composition by heating.

2. The method according to claim 1, wherein said composition is a gap filling composition comprising:
   the polymer and a solvent.

3. The method according to claim 2, wherein said solvent is selected from the group consisting of water, propylene glycol monomethyl ether acetate, propylene glycol monomethyl ether, isopropyl alcohol, n-butyl alcohol, methyl isobutyl ketone, tetrahydrofuran, dibutyl ether, ethyl lactate, methyl acetate, ethyl acetate, butyl acetate, 2-heptanone, γ-butyrolactone, and a combination thereof.

4. The method according to claim 2, a compound, a base, or a base-generating compound.

5. The method according to claim 4, wherein said acid, said acid-generating compound, said base, or said base-generating compound is selected from the group consisting of primary amine, secondary amine, tertiary amine, quaternary ammonium salt, cyclic amine nitrogen-containing heterocyclic compound, sulfonic acid, carboxylic acid, carboxylic amide, and a salt thereof.

6. The method according to claim 4, wherein the mass ratios of said polymer, said organic solvent, and said acid, said acid-generating compound, said base, or said base-generating compound to the total mass of the gap filling composition are not less than 2% and not more than 30%, not less than 70% and not more than 98%, and more than 0% and not more than 10%, respectively.

7. The method according to claim 4, wherein said gap filling composition further comprises a surfactant, a fungicide, an antimicrobial agent, and/or an antifungal agent.

8. The method according to claim 1, comprising forming, by dry etching and/or wet etching, a mask for etching said layer to be processed.

9. The method according to claim 1, wherein said step (A4) is carried out by heating at not less than 100° C. and not more than 500° C. for not less than 30 seconds and not more than 300 seconds.

10. The method according to claim 1, wherein in said step (A1) an etching amount in a depth direction of said layer to be processed is not less than 0.05 µm and not more than 6.00 µm.

11. The method according to claim 1, wherein an aspect ratio of said pattern is not less than 5 and not more than 25.

12. The method according to claim 1, wherein the polymer is polyethylene glycol.

13. The method according to claim 1, wherein the polymer is polypropylene glycol.

14. The method according to claim 1, wherein the polymer is polypropylene carbonate.

15. The method according to claim 1, wherein the polymer is polyethylene carbonate.

16. A pattern forming method comprising:
(B1) a step of forming a resist film on a surface of a layer to be processed;
(B2) a step of exposing said resist film;
(B3) a step of contacting a composition comprising a polymer selected from the group consisting of polyethylene glycol, polypropylene glycol, polypropylene carbonate, polyethylene carbonate, polyethylene propylene glycol, and combination of two or more of these polymers and having a mass average molecular weight of not less than 1,000 and not more than 500,000 with said resist film; and
(B4) a step of dry-etching said resist film and said layer to be processed,
wherein an etching rate of said resist film under a dry-etching condition in said step (B4) is not more than 0.5 times as large as an etching rate of said layer to be processed.

17. The method according to claim 16, wherein the composition is a gap filling composition comprising:
the polymer and a solvent.

18. The method according to claim 16, wherein said resist film is derived from a metal-containing resist composition.

19. The method according to claim 16, wherein an oxygen-containing gas is used in said step (B4).

* * * * *